United States Patent [19]

Furukawa et al.

[11] Patent Number: 5,693,180

[45] Date of Patent: Dec. 2, 1997

[54] DRY ETCHING METHOD FOR A GALLIUM NITRIDE TYPE COMPOUND SEMICONDUCTOR

[75] Inventors: Katsuki Furukawa, Sakai; Satoshi Sugahara, Nara, both of Japan

[73] Assignee: Sharp Kabushiki Kaisha, Osaka, Japan

[21] Appl. No.: 639,178

[22] Filed: Apr. 26, 1996

[30] Foreign Application Priority Data

Apr. 25, 1995 [JP] Japan ..................... 7-101140

[51] Int. Cl.⁶ .................................. H01L 21/00
[52] U.S. Cl. ..................... 156/643.1; 156/662.1; 252/79.1; 216/67
[58] Field of Search .................. 156/643.1, 662.1; 252/79.1; 216/2, 67; 437/234

[56] References Cited

FOREIGN PATENT DOCUMENTS 2-291125 11/1990 Japan .
4-34929 2/1992 Japan .

OTHER PUBLICATIONS

Peaton et al., "Low bias electron cyclotron resonance plasma etching of GaN, AlN, and InN" *Appl. Phys. Lett.* (1994) 64(17):2294–2296.

Lin et al., "Reactive ion etching of GaN using BCl₃" *Appl. Phys. Lett* (1994) 64(7): 887–888.

*Primary Examiner*—William Powell
*Attorney, Agent, or Firm*—Morrison & Foerster LLP

[57] ABSTRACT

A dry etching method for etching a gallium nitride type compound semiconductor is disclosed. The method uses a mixed gas including silicon tetrachloride ($SiCl_4$) gas and chlorine ($Cl_2$) gas as an etching gas in a reactive ion etching.

9 Claims, 3 Drawing Sheets

DRY ETCHING METHOD FOR A GALLIUM NITRIDE TYPE COMPOUND SEMICONDUCTOR

BACKGROUND OF THE INVENTION

1. Field of the Invention

The present invention relates to a dry etching method for etching a gallium nitride type compound semiconductor. More specifically, the present invention relates to a reactive ion etching method for the gallium nitride type compound semiconductor.

2. Description of the Related Art

Gallium nitride type compound semiconductors (i.e., $Al_xGa_{1-x}N(0 \leq x \leq 1)$ and/or $In_{1-y}Ga_yN(0 \leq y \leq 1)$ semiconductors) have been receiving attention as the material for blue-light emitting devices. In order to fabricate light emitting devices and semiconductor devices using the gallium nitride type compound semiconductors ($Al_xGa_{1-x}N$ ($0 \leq x \leq 1$), $In_{1-y}Ga_yN(0 \leq y \leq 1)$ semiconductors), crystal growth technology and device fabrication technology must be established. Particularly, it is essential to establish processing technology for forming a mesa structure and the like; especially etching technology, which is a device fabrication technology.

However, gallium nitride type compound semiconductors are highly stable materials. Therefore, gallium nitride type compound semiconductors cannot be etched near the room temperature with etchants commonly used to etch other compounds of III–V group, such as hydrochloric acid (HCl), sulfuric acid ($H_2SO_4$), nitric acid ($HNO_3$), hydrofluoric acid (HF), and mixed solutions thereof.

Various methods of wet etching gallium nitride type compound semiconductors reported by laboratories include a method using a solution obtained by heating caustic soda (sodium hydroxide), caustic potash (potassium hydroxide), and the like, to a temperature of 800° C. or more; and a method using an etchant obtained by heating a mixture of phosphoric acid and sulfuric acid to a temperature of approximately 200° C., and the like. However, all of the above-mentioned methods employ the corrosive substances at high temperatures, and therefore, pose a problem in safety and controllability of etching rate and the like. Accordingly, they are not technologies which are not suitable for industrial use.

There are only a few reports on the employment of an etching gas used for semiconductors and the like, and only a few of those reports are concerned with a dry etching of gallium nitride type semiconductor. Accordingly, the dry etching technology is still not sufficiently established. The following methods have been reported as dry etching methods for the gallium nitride type semiconductors:

1. In a reactive ion etching (RIE) method, dichlorodifluorocarbon ($CCl_2F_2$), carbon tetrachloride ($CCCl_4$), carbon tetrafluoride ($CF_4$), silicon tetrachloride ($SiCl_4$), boron trichloride($BCl_3$), a mixed gas of silicon tetrachloride ($SiCl_4$) and Argon (Ar) or silicon tetrafluoride ($SiF_4$) is used;
2. In a gas bias electron cyclotron resonance (ECR) plasma etching method, a mixed gas of chlorine ($Cl_2$) and hydrogen ($H_2$) or methane ($CH_4$), $H_2$ and Ar is used as an etching gas; and
3. In a reactive fast atom beam etching method, $Cl_2$ gas is used as an etching gas.

The gallium nitride type compound semiconductors are highly stable materials. Accordingly, even if the above mentioned devices and etching gas for other semiconductors and the like are used, a practical etching rate, flatness of the etched surface, and flatness and the verticality of the etched end face cannot be sufficiently obtained. Specifically, when the above-mentioned methods and etching gas are used for the gallium nitride type compound semiconductors, the etching rate obtained therefrom is 80 nm per minute at most, whereas the practical etching rate must be 150 nm or more per minute. Moreover, when gallium nitride type compound semiconductors having crystals with a wurtzite (zincblende) structure is used, the roughness of the etched surface becomes large; furthermore, there are some cases where needle-like substances deemed to be caused by residues remain on the surface thereof. Accordingly, problems arise such that even if a mirror for a resonator used in a laser diode (LD) is intended to be fabricated by etching, the etched mirror (i.e., mirror formed by etching) cannot be realized because the flatness of the etched end face is poor.

SUMMARY OF THE INVENTION

The dry etching method for etching a gallium nitride type compound semiconductor of this invention use a mixed gas including silicon tetrachloride ($SiCl_4$) gas and chlorine ($Cl_2$) gas as an etching gas in a reactive ion etching.

In one embodiment of the invention, the mixed gas the essentially consists of silicon tetrachloride ($SiCl_4$) gas and chlorine ($Cl_2$) gas.

In one embodiment of the invention, the mixed gas further includes nitrogen ($N_2$) gas.

In one embodiment of the invention, a silicon layer is used as a cathode electrode cover layer, and the gallium nitride type compound semiconductor is provided above the silicon layer.

In one embodiment of the invention, a silicon dioxide ($SiO_2$) layer formed by a plasma chemical vapor deposition (CVD) method is used as an etching mask.

In one embodiment of the invention, the gallium nitride type compound semiconductor includes at least one of $Al_xGa_{1-x}N(0 \leq x \leq 1)$ $In_{1-y}Ga_yN(0 \leq y \leq 1)$ semiconductors.

According to another aspect of the invention, a dry etching method for etching a gallium nitride type compound semiconductor uses chlorine ($Cl_2$) gas as an etching gas for a reactive ion etching, a silicon layer is used as a cathode electrode cover layer, and the gallium nitride type compound semiconductor is provided above the silicon layer.

In one embodiment of the invention, a silicon dioxide ($SiO_2$) layer formed by a plasma chemical vapor deposition (CVD) method is used as an etching mask.

In one embodiment of the invention, the gallium nitride type compound semiconductor includes at least one of $Al_xGa_{1-x}N(0 \leq x \leq 1)$ and $In_{1-y}Ga_yN(0 \leq y \leq 1)$ semiconductors.

According to a dry etching method of the present invention, when a gallium nitride type compound semiconductor is dry-etched, a sufficient etching rate, an excellent etched surface and an excellent etched end face can be obtained.

Thus, the invention described herein makes possible the advantages of providing a dry etching method for gallium nitride type semiconductors allowing the fabrication of an etched surface and an etched end face having excellent flatness required for semiconductor devices.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples.

EXAMPLE 1

Figure 4:
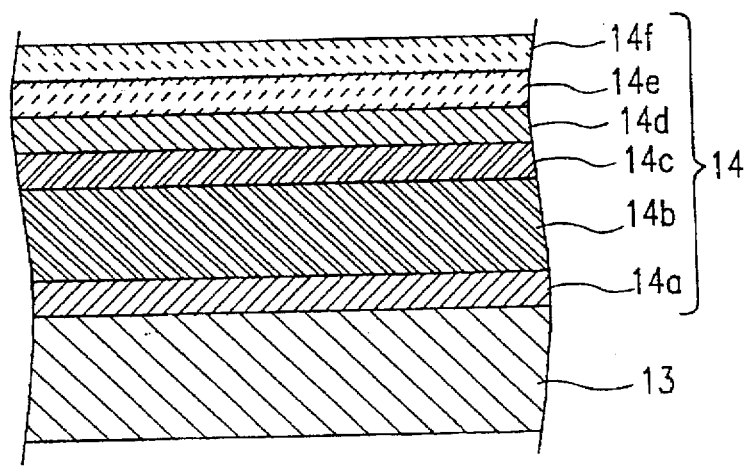
FIG. 4 is a schematic view showing a cross-section of a GaN multilayered structure used in an example of the present invention.

A sample 6, which is to be subjected to etching, having a gallium nitride type compound semiconductor, for example, a GaN multilayered structure 14 shown in FIG. 4 is grown by a Metal Organic Chemical Vapor Deposition (MOCVD) method. A (0001) sapphire C plane is used as a substrate.13. As a gas of the III group, trimethylgallium (TMG), trimethyl-aluminum (TMA), and trimethylindium (TMI) are used. As a gas of the V group, ammonia ($NH_3$) is used. As a doping gas, monosilane ($SiH_4$) and biscyclopentadienylmagnesium ($Cp_2Mg$) are used. As a carrier gas, hydrogen ($H_2$) is used.

The sapphire substrate 13 is introduced into the MOCVD apparatus, then the surface of the substrate 13, which is heated to approximately 1100° C., is processed in a $H_2$ atmosphere. Next, the substrate temperature is lowered to approximately 600° C., and under this temperature a GaN or AlN buffer layer 14a is grown. The thickness of the GaN or AlN buffer layer 14a is approximately 35 nm or approximately 50 nm, respectively. Again, the substrate temperature is increased to about 1100° C., and under this temperature an n-type GaN layer 14b is grown to a thickness of approximately 4 m, and an n-type AlGaN lower clad layer 14c is grown to have a thickness of approximately 150 nm. After that, the substrate temperature is lowered to approximately 800° C., and under this temperature a Zn doped InGaN activated layer 14d (i.e., a light-emitting layer) is grown to have a thickness of approximately 50 nm. Then, the substrate temperature is increased to about 1100° C., and under this temperature a p-type AlGaN upper clad layer 14e and a p-type cap layer 14f are grown to have thicknesses of 50 nm and 300 nm, respectively. As a result, the sample 6 having the GaN multilayered structure 14 for a light-emitting diode is obtained.

Figure 3A:
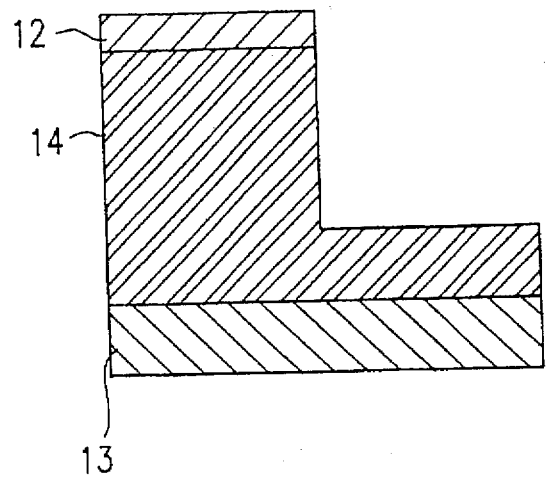
FIG. 3A is a schematic view showing a cross-section of a GaN multilayered structure etched according to an example of the present invention.
Figure 3B:
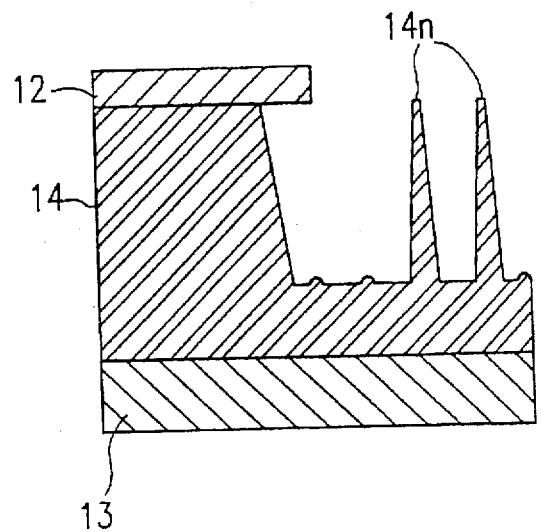
FIG. 3B is a schematic view showing a cross-section section of a GaN multilayered structure etched according to a comparative example.

Next, in order to form a mesa structure in the thus-obtained GaN multilayered structure 14, a silicon dioxide ($SiO_2$) layer used as an etching mask 12 is formed by a plasma CVD method using monosilane gas ($SiH_4$) and nitrous oxide ($N_2O$). The thickness of the $SiO_2$ layer is approximately 200 nm. Subsequently, the $SiO_2$ layer is subjected to patterning by photolithography. The etching of the $SiO_2$ layer is performed by wet etching using hydrofluoric acid (HF) or by plasma etching using carbon tetrafluoride ($CF_4$). As a result, the mask 12 made of $SiO_2$ used for etching the GaN multilayered structure 14 is formed (FIGS. 3A and 3B).

Figure 1:
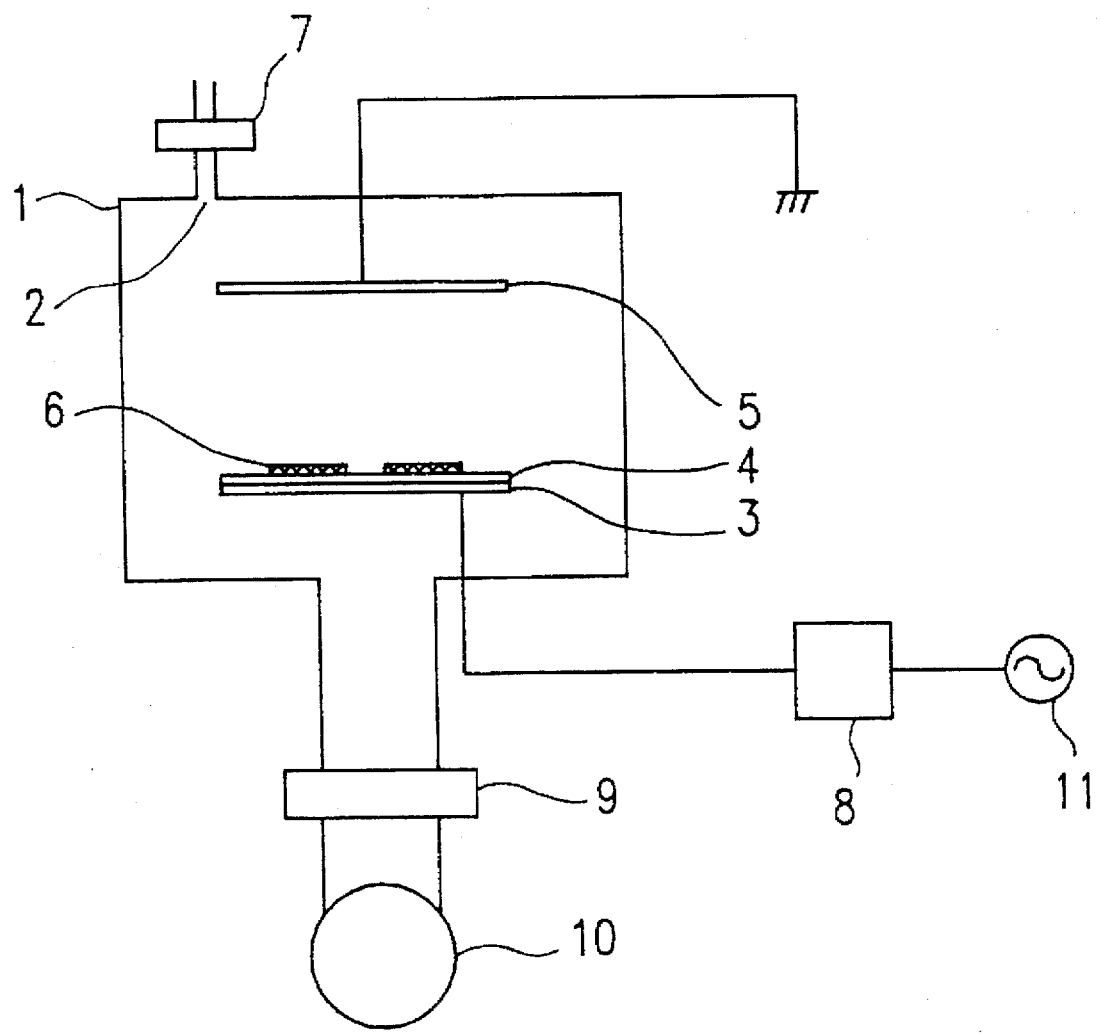
FIG. 1 is a diagram showing a RIE device used for the etching of the present invention.

Next, the sample 6 having the GaN multilayered structure 14, on which the patterned $SiO_2$ layer as a mask is formed, is provided on a cathode electrode 3 made of quartz in a parallel-plate type RIE apparatus shown in FIG. 1 (in this example cathode electrode cover layer 4 is not provided). The inside of the chamber 1 of the RIE apparatus is evacuated by a vacuum pump 10. Then, as an etching gas, $Cl_2$ gas with a flow rate of 20 sccm (standard cubic cm per minute) and $SiCl_4$ gas with a flow rate of 10 sccm are introduced from etching gas introduction portion 2 into the chamber 1 through a mass flow controller 7 of the RIE apparatus. The flow rate of the etching gas is preferably in a range of about 10 sccm to 100 sccm. The pressure in the chamber 1 is adjusted to about 30 mTorr by a conductance control valve 9. After the pressure is stabilized, a high-frequency power of 200 W (13.56 MHz) is applied to the cathode electrode 3 by a high-frequency power source 11 through an impedance matching unit 8. An anode electrode 5 is grounded. In this example, the distance between the cathode electrode 3 and the anode electrode 5 is about 70 mm, and the diameter of the electrodes 3 and 5 is about 6 inches.

Approximately 1 μm of the GaN multilayered structure 14 is removed by etching for about 5 minutes. The etching rate thereof is 200 nm per minute. Only approximately 16.5 nm of the $SiO_2$ layer used as the mask 12 is removed by etching for about 5 minutes. That is, the selectivity of GaN/$SiO_2$ is approximately 60. Accordingly, it is recognized that the $SiO_2$ layer is satisfactorily used as the etching mask 12.

Figure 2:
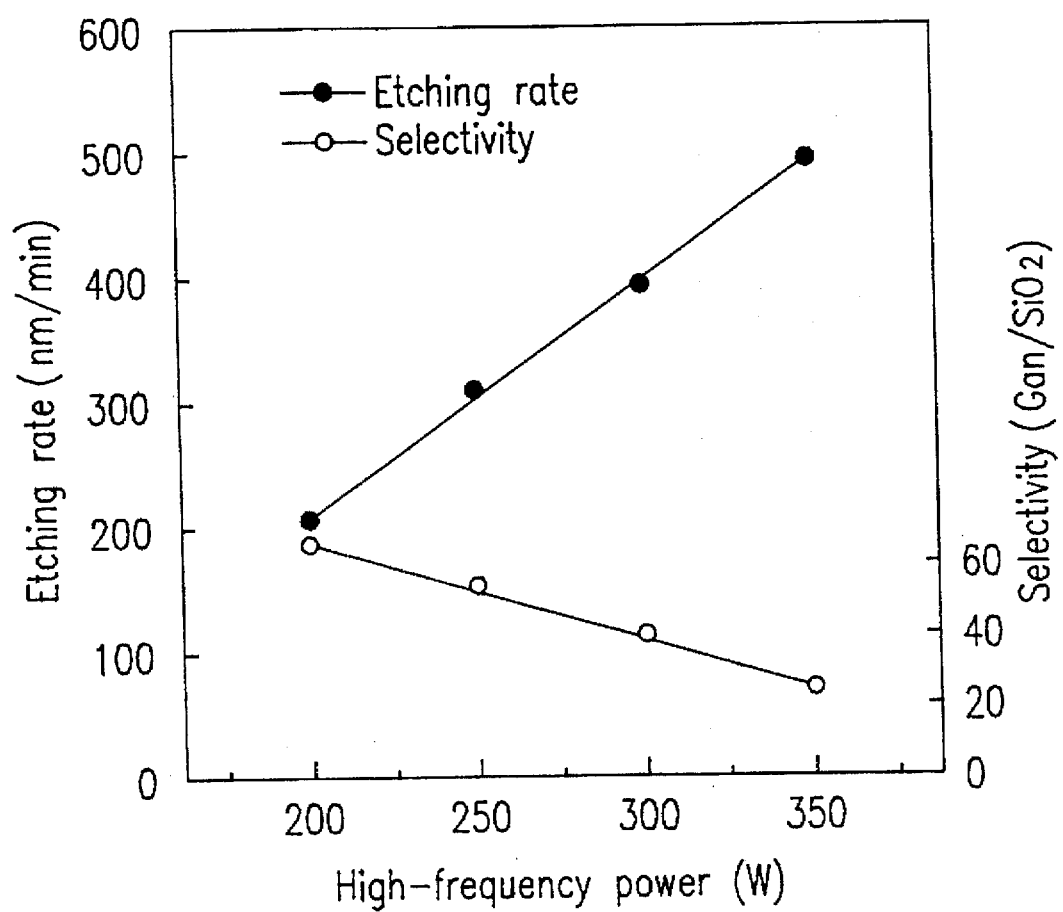
FIG. 2 is a diagram illustrating the relationship between high-frequency electric power, etching rate, and selectivity.

FIG. 2 shows the relationships between the etching rate, the selectivity, and the high-frequency power in the case of using $Cl_2$ gas and $SiCl_4$ gas. As the high-frequency power increases from about 200 W to about 350 W, the etching rate increases from about 200 nm/min to about 500 nm/min and the selectivity decreases from about 60 to about 20. It is understood that the $SiO_2$ layer is satisfactorily used as the etching mask 12 in the high-frequency power range of about 200 W to about 350 W. Satisfactory etching rate and selectivity for the practical use are obtained under the etching conditions shown in FIG. 2.

FIG. 3A shows a cross-section of the sample 6 having the GaN multilayered structure 14 etched as described above. The surface roughness is measured by using a surface profilometer (surface roughness tester). The etched surface has the roughness of about 3 nm or less and the verticality of the etched end face is excellent as shown in FIG. 3A. In addition, the flatness of the end face is also excellent.

COMPARATIVE EXAMPLE 1

As a comparison, etching is performed under the conditions identical to those for Example 1, except that only $Cl_2$ gas is used as an etching gas for etching the GaN multilayered structure 14. As a result, the etching rate is approximately 220 nm per minute, which is substantially identical to that obtained in Example 1. However, the needle-like structures 14n remain non-etched on the etched surface as shown in FIG. 3B, so that the etched surface with the excellent flatness can not be obtained. In addition, the etching anisotropy of the etched end face is also deteriorated, so that the undercut is formed as shown in FIG. 3B. As a result, the verticality and the flatness of the etched end face are deteriorated.

COMPARATIVE EXAMPLE 2

As a comparison, etching is performed under conditions identical to those of Example 1, except that $SiCl_4$ gas or BCl₃ gas is used as an etching gas for a GaN multilayered structure 14. As a result, the etching rate is as small as approximately 40 nm per minute for SiCl₄ or approximately 50 nm per minute BCl₃, respectively. Accordingly, the practical requirements can not be satisfied.

COMPARATIVE EXAMPLE 3

As a comparison, the etching mask 12 is formed by a method other than a plasma CVD method. Specifically, etching is performed under conditions identical to those of Example 1 except that the mask 12 for etching a GaN multilayered structure 14, is different from that used in Example 1. In this comparative example, a photoresist layer, a gold (Au) layer formed by vapor deposition method and an SiO₂ layer formed by a high-frequency sputtering method or an electron beam deposition method are used.

In the case of using the photoresist layer as the mask 12, approximately 1.2 μm of the photoresist layer is removed by etching, and the selectivity thereof is approximately 0.8. On the other hand, in the case of using the Au layer as the mask 12, the entire layer is etched. Therefore, it is realized that both of the layers have small selectivities, and not suitable as the mask materials.

As for the SiO₂ according to this comparative example, approximately 16 nm or approximately 18.5 nm of the SiO₂ layer respectively formed by the high-frequency sputtering method or the electron beam deposition method is removed by etching. Although these values are sub-stantially identical to those obtained in the case where a SiO₂ layer formed by a plasma CVD method is employed, the pattern formation is conducted more easily by a plasma CVD method. As a result, it is realized that SiO₂ is suitable as the material of the mask 12, and a plasma CVD method is suitable for forming an SiO₂ layer as the etching mask 12.

EXAMPLE 2

The sample 6 having the GaN multilayered structure structure 14 used in Example 2 is the same as that of Example 1. In this example, an SiO₂ layer used as the etching mask 12 is formed by a plasma CVD method using monosilane gas (SiH₄) and nitrous oxide (N₂O). The SiO₂ layer has a thickness of approximately 100 nm. Subsequently, the SiO₂ layer is subjected to patterning by photolithography. The SiO₂ layer is etched by wet etching using hydrofluoric acid (HF) or plasma etching using carbon tetrafluoride (CF₄). As a result, the mask 12 made of SiO₂ used for etching the GaN multilayered structure 14 is formed.

Next, an Si layer is disposed on a cathode electrode 3 as an electrode cover film 4 in a parallel-plate type RIE apparatus as shown in FIG. 1. Subsequently, the sample 6 having the GaN multilayered structure 14 is provided on the Si cover 4, and the inside of the chamber 1 of the RIE apparatus is evacuated. Next, Cl₂ gas is introduced into the chamber 1 as an etching gas, and the pressure in the chamber 1 is adjusted to 10 mTorr. The flow rate of the Cl₂ gas is 50 sccm. After the pressure is stabilized, a high-frequency power is applied thereto, so that the GaN multilayered structure 14 is etched. Approximately 900 nm of the GaN multilayered structure 14 is removed by etching for about 5 minutes, and the etching rate is 180 nm per minute. Approximately 50 nm of the SiO₂ mask 12 is removed by etching for about 5 minutes. That is, the selectivity of GaN/SiO₂ is approximately 18. Accordingly, it is realized that the SiO₂ layer can be used as the mask 12. The etched surface has a roughness of 3 nm or less according to the measurement using a surface profilometer. As a result, it is realized that the etched end face also has the excellent verticality and the excellent flatness.

As shown in Comparative example 1, when the RIE etching is performed using only Cl₂ gas without using Si as a cathode electrode cover film 4, needle-like structures 14n remain and etching anisotropy is poor. In this example, a highly reductive material such as SiCl₄ is generated by a reaction between Si and Cl. Therefore, a natural oxide layer formed on the surface of the GaN multilayered structure 14 is removed by the etching, so that the needle-like residues are not formed. In addition, an Si-type protective layer is formed on the end face, and Cl₂ gas prevents the isotropic plasma etching. As a result, the excellent verticality and flatness of the etched end face can be obtained.

EXAMPLE 3

The sample 6 having the GaN multilayered structure 14 used in Example 3 is the same as that of Example 1. A silicon dioxide (SiO₂) layer used as the mask 12 is formed by a plasma CVD method as described in Example 1. The SiO₂ mask 12 has a thickness of approximately 100 nm. Subsequently, the SiO₂ layer is subjected to patterning by photolithography. The SiO₂ layer is etched by wet etching using hydrofluoric acid (HF) or by plasma etching using carbon tetrafluoride (CH₄). As a result, the mask 12 made of SiO₂ used for etching the GaN multilayered structure 14 is formed.

The sample 6 having the GaN multilayered structure 14 is provided on the cathode electrode 3 made of Al treated with almite processing, in a parallel-plate type RIE apparatus. The inside of the chamber 1 of the RIE apparatus is evacuated. Next, a mixed gas of Cl₂ gas, SiCl₄ gas, and N₂ gas is introduced into the chamber 1 as an etching gas, and the pressure in the chamber is adjusted to about 30 mTorr. The respective flow rates of the Cl₂ gas, the SiCl₄ gas, and the N₂ gas are 20 sccm, 10 sccm, and 10 sccm. After the pressure is stabilized, a high-frequency power is applied to the cathode electrode 3. Approximately 800 nm of the GaN multilayered structure 14 is removed by etching for about 5 minutes. The etching rate is 180 nm per minute. Approximately 20 nm of the SiO₂ layer used as the mask 12 is removed by etching for about 5 minutes. That is, the selectivity of GaN/SiO₂ is approximately 45. Accordingly, it is realized that the SiO₂ layer can be used as the etching mask 12. The etched surface has a roughness of 1 nm according to the measurement using a surface profilometer. Moreover, the etched end face has an excellent verticality and an excellent flatness. Particularly, the flatness of the etched end face is improved by adding N₂ gas to the etching gas as compared with Example 1, and the flatness of the surface is excellent enough to realize an etching mirror for a laser diode.

EXAMPLE 4

The sample 6 having the GaN multilayered structure 14 used in Example 4 is the same as that in Example 1. A silicon dioxide layer (SiO₂) used as the mask 12 is formed by a plasma CVD method using monosilane gas (SiH₄) and nitrous oxide gas (N₂O). The SiO₂ mask 12 has a thickness of approximately 100 nm. Subsequently, the SiO₂ layer is subjected to patterning by photolithography. The SiO₂ layer is etched by wet etching using hydrofluoric acid (HF) or by plasma etching using carbon tetrafluoride (CF₄. As a result, the mask 12 made of SiO₂ used for etching the GaN multilayered structure 14 is formed.

Next, an Si layer is disposed on a cathode electrode 3 as the cathode electrode cover layer 4 in a parallel-plate type RIE apparatus. Subsequently, the sample 6 having the GaN multilayered structure 14 is provided on the Si cover layer 4, and the inside of the chamber of the RIE apparatus is evacuated. Next, a mixed gas of $Cl_2$ gas and $N_2$ gas is introduced into the chamber as an etching gas, and the pressure in the chamber is adjusted to about 10 mTorr. The respective flow rates of the $Cl_2$ gas and the $N_2$ gas are 40 sccm and 20 sccm. After the pressure is stabilized, a high-frequency power of about 200 W is applied, and the GaN multilayered structure 14 is etched. About 800 nm of the GaN multilayered structure 14 is removed by etching for about 5 minutes. The etching rate is about 180 nm per minute. Approximately 50 nm of the $SiO_2$ layer used as the mask 12 is removed by etching for about 5 minutes. That is, the selectivity of $GaN/SiO_2$ is approximately 16. Accordingly, it is realized that the $SiO_2$ layer can be used as the etching mask 12. The etched surface has a roughness of 1 nm or less according to the measurement using a surface profilometer. In addition, the etched end face also has an excellent verticality and an excellent flatness. Particularly, the flatness of the etched end face is improved by adding $N_2$ gas to the etching gas as compared with Example 1, and the flatness of the surface is excellent enough to realize an etching mirror for a laser diode.

According to the present invention, when a gallium nitride type compound semiconductor (e.g., the GaN multilayered structure 14) is etched, it is possible to obtain the excellent flatness of the etched surface, and excellent verticality and flatness of the etched end face. As a result, the characteristics of a semiconductor device, specifically a light emitting diode (LED) and a laser diode (LD) using a gallium nitride type compound semiconductor, can be improved. In the above-described examples, the GaN multilayered structure 14 is used as a gallium nitride type compound semiconductor. However, the dry etching method of the present invention is not limited thereto. The dry etching method of the present invention is applicable to a gallium nitride type compound semiconductor including at least one of $Al_xGa_{1-x}N(0 \leq x \leq 1)$ and $In_{1-y}Ga_yN(0 \leq y \leq 1)$ semiconductors. Moreover, the dry etching method of the present invention is applicable to a gallium nitride type compound semiconductor expressed by a general formula: XGaYN (X and Y represent elements included as minor components for Ga and N, respectively).

Various other modifications will be apparent to and can be readily made by those skilled in the art without departing from the scope and spirit invention. Accordingly, it is not intended that the scope of the claims appended hereto be limited to the description as set forth herein, but rather that the claims be broadly construed.

What is claimed is:

1. A dry etching method for etching a gallium nitride type compound semiconductor, wherein a mixed gas including silicon tetrachloride ($SiCl_4$) gas and chlorine ($Cl_2$) gas is used as an etching gas in a reactive ion etching.

2. A dry etching method according to claim 1, wherein the mixed gas essentially consists of silicon tetrachloride ($SiCl_4$) gas and chlorine ($Cl_2$) gas.

3. A dry etching method according to claim 1, wherein the mixed gas further includes nitrogen ($N_2$) gas.

4. A dry etching method according to claim 1, wherein a silicon layer is used as a cathode electrode cover layer, and the gallium nitride type compound semiconductor is provided above the silicon layer.

5. A dry etching method according to claim 1, wherein a silicon dioxide ($SiO_2$) layer formed by a plasma chemical vapor deposition (CVD) method is used as an etching mask.

6. A dry etching method according to claim 1, wherein the gallium nitride type compound semiconductor includes at least one of $Al_xGa_{1-x}N(0 \leq x \leq 1)$ and $In_{1-y}Ga_yN(0 \leq y \leq 1)$ semiconductors.

7. A dry etching method for etching a gallium nitride type compound semiconductor, wherein chlorine ($Cl_2$) gas is used as an etching gas in a reactive ion etching, a silicon layer is used as a cathode electrode cover layer, and the gallium nitride type compound semiconductor is provided above the silicon layer.

8. A dry etching method according to claim 7, wherein a silicon dioxide ($SiO_2$) layer formed by a plasma chemical vapor deposition (CVD) method is used as an etching mask.

9. A dry etching method according to claim 7, wherein the gallium nitride type compound semiconductor includes at least one of $Al_xGa_{1-x}N(0 \leq x \leq 1)$ and $In_{1-y}Ga_yN(0 \leq y \leq 1)$ semiconductors.

* * * * *